United States Patent [19]

Malchow

[11] 4,385,400
[45] May 24, 1983

[54] AUTOMATIC GAIN CONTROL ARRANGEMENT USEFUL IN AN FM RADIO RECEIVER

[75] Inventor: Max E. Malchow, Flemington, N.J.
[73] Assignee: RCA Corporation, New York, N.Y.
[21] Appl. No.: 143,347
[22] Filed: Apr. 24, 1980
[51] Int. Cl.³ .............................................. H04B 1/26
[52] U.S. Cl. .................................. 455/239; 455/234; 455/251
[58] Field of Search ............... 455/205, 232, 234, 236, 455/239, 240, 245, 249, 251, 334; 307/248, 239, 260, 350; 330/129

[56] References Cited

U.S. PATENT DOCUMENTS

| 3,167,713 | 1/1965 | Bastian | 455/234 |
| 3,673,499 | 6/1972 | Avins | 455/205 |
| 3,689,752 | 9/1972 | Gilbert | 307/229 |
| 4,186,351 | 1/1980 | Brefini | 455/234 |
| 4,263,560 | 4/1981 | Ricker | 330/129 |

OTHER PUBLICATIONS

Linear Integrated Circuits–CA3089E FM IF System, RCA Solid State Division, Supersedes Issue Date 8-72, Printed 6/78.
Linear Integrated Circuits–CA3189E FM IF System, RCA Solid State Divison, Supersedes Issue Date 11-77, Printed 9-78.

Primary Examiner—Tommy P. Chin
Attorney, Agent, or Firm—E. M. Whitacre; A. L. Limberg; P. M. Emanuel

[57] ABSTRACT

In an FM receiver including a plurality of cascaded amplifier stages for successively amplifying an IF signal to form a pulse signal which is demodulated to derive an audio signal, an auxiliary amplifier section beside the cascade is provided to amplify a signal developed at an intermediate point in the cascade to form a signal from which a control signal for controlling the gain of an RF amplifier. The auxiliary amplifier section includes a first linear amplifier including degenerative signal feedback followed in cascade by a second linear amplifier including a gain control arrangement. The latter is responsive to a logarithmic gain control signal generated by a logarithmic amplifier in response to the output signal of a peak detector following the auxiliary amplifier. The control signal has a relatively wide control range, e.g., 10 to 500 microvolts of RF input signal, suitable for controlling the gain of an RF stage.

16 Claims, 5 Drawing Figures

AUTOMATIC GAIN CONTROL ARRANGEMENT USEFUL IN AN FM RADIO RECEIVER

ENVIRONMENT OF THE PRESENT INVENTION

The present invention pertains to the field of automatic gain control arrangements for radio receivers.

In receivers which process amplitude modulated (AM) carriers, detectors are employed to derive information bearing signals in response to changes in the amplitude of the carriers relative to a reference amplitude. Accordingly, automatic gain control (AGC) arrangements are typically employed in television and AM radio receivers for controlling the gains of RF and IF amplifier stages to provide a normalized signal to the detectors of the receivers.

In receivers which process angle modulated, i.e., phase modulated (PM) or frequency modulated (FM) carriers, detectors are employed to derive information bearing signals in response to changes in the phase or frequency of the carriers relative to a reference phase or frequency. Receivers which process angle modulated signals, typically include a number of cascaded high gain amplifier stages in an intermediate frequency (IF) section which successively amplify the IF signal toward a symmetrical amplitude limiting condition so that the last stage provides a pulse signal having a substantially constant amplitude for the detector. Accordingly, one would expect that AGC arrangements would not need to be employed in FM radio receivers.

However, for a variety of reasons, most modern FM radio receivers employ some sort of arrangement for deriving a control signal indicative of amplitude or strength of received radio frequency (RF) carriers. In an FM radio a control signal indicative of input signal strength may be applied to a meter or other indicator to display when a particular station is properly tuned. In addition, a control signal indicative of input signal strength may also be applied to a stereo/monaural switching or blending circuit to disable a stereo decoder under weak input signal conditions since, under such conditions, noise adversely affects stereo performance more than it affects monaural performance.

It has also been found desirable to provide a control signal indicative of signal strength in FM receivers to reduce the gain of radio frequency (RF) amplifier stages when exceptionally strong RF carriers are received to minimize interference which may otherwise be produced. This is particularly desirable in locations where a relatively large number of strong RF carriers are received since the RF filter stages are typically incapable of attenuating exceptionally high amplitude non-selected RF carriers sufficiently to prevent them from being heterodyned by non-linear portions of the RF amplifier stages to produce undesired intermodulation products. Such situations are apt to occur with an automobile FM receiver when the automobile is driven in an urban area where several powerful stations are located.

Prior AGC arrangements for FM receivers have employed control signals indicative of input signal strength derived by control circuits primarily designed to provide control signals for tuning indicators such as signal strength or "S" meters and for stereo/monaural switching arrangements. While such control circuits provide control signals acceptable for the latter applications, they are not particularly well suited to control the gain of RF amplifier stages.

Specifically, in prior AGC arrangements, such as disclosed in U.S. Pat. No. 3,673,499, entitled "Combined Tuning and Signal Strength Indicator Circuit with Signal Strength Indication Derived from Each IF Amplifying Stage", issued in the names of Avins and Craft on June 27, 1972, a control signal indicative of signal strength over a very wide input amplitude range is generated by summing signals indicative of the amplitude of the signals present in each of the cascaded amplifier or limiter stages in the IF section of a receiver. The resultant control signal exhibits a "scalloped" non-linearity which tends to introduce error. Also of particular concern is that the portion of the resultant control signal which is derived from the first of the cascaded amplifier stages is affected by contributions derived from remaining stages. This is not desirable since the output signal of the first stage is last to reach an amplitude limiting condition and is therefore the most useful signal from which to derive a control signal for controlling the gain of RF amplifier stages to inhibit the generation of intermodulation signal due to excessively high amplitude RF input signals. Thus, the control signals generated by such prior arrangements do not provide a particularly reliable indication of the amplitude of relatively large amplitude input signals. In addition, since the control signal is derived directly from the limiter stages, the range in which it will respond to changes of the amplitude of the input signal and the rate at which it changes as a function of the amplitude of the input signal is primarily determined by the gain characteristics of the limiter stages. As a result, the range and rate of such a control signal cannot be properly set for controlling RF amplifier stages without compromising the gain characteristics of the limiter stages most desirable for effective limiting.

SUMMARY OF THE PRESENT INVENTION

The present invention concerns an auxiliary amplifier arrangement for use, e.g., in an FM receiver, which is beside at least a portion of the cascade of limiter stages in a receiver for amplifying an intermediate signal developed at a predetermined point in the cascade to develop a main control signal which has a magnitude representing the amplitude of the RF input signal. The characteristics of the auxiliary amplifier arrangement are selected to determine the range and rate of change of the main control signal. In a preferred embodiment, the range and rate of change of the main control signal are selected to enable it to be used to reduce the gain of an RF amplifier stage at high amplitudes of the RF input signal to inhibit the generation of undesired intermodulation products. Desirably the auxiliary amplifier arrangement includes a gain control stage and a logarithmic amplifier for deriving an auxiliary control from the main control signal which has a magnitude which is logarithmically related to the magnitude of the main control signal for controlling the gain of the auxiliary amplifier arrangement. This tends to make the magnitude of the main control signal have a generally linear relationship to the logarithm of the amplitude of the RF input signal.

DETAILED DESCRIPTION OF THE DRAWING

Figure 1:
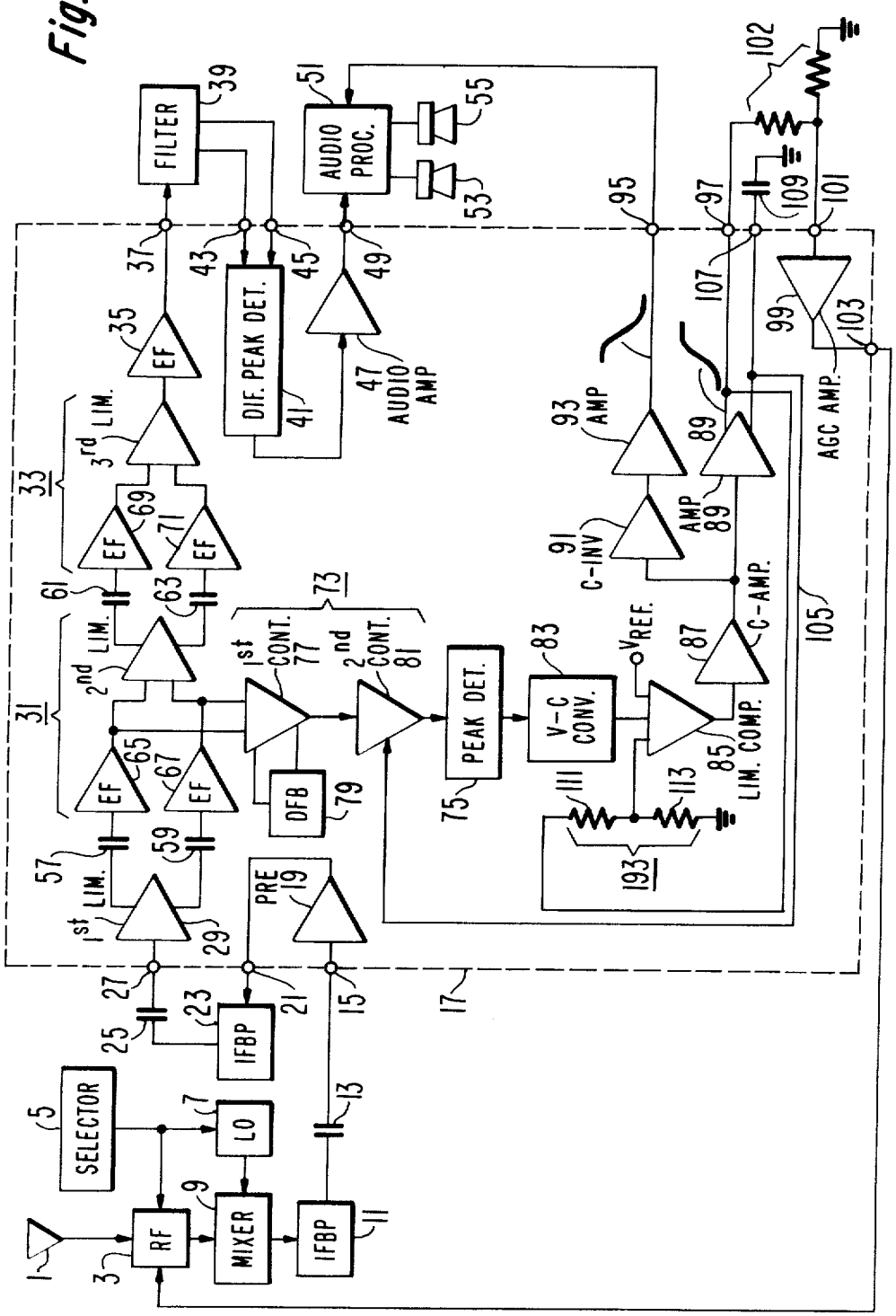
FIG. 1 is a schematic, in block form, of an FM radio receiver employing an AGC arrangement constructed in accordance with the present invention.

In FIG. 1, an FM radio receiver includes an antenna 1 for acquiring RF carriers in the FM radio frequency range. A voltage-controlled tuned circuit (not specifically shown) of an RF section 3 is controlled in response to the magnitude of a d-c tuning voltage generated by a station selector 5 to select the one of the RF carriers associated with the selected station. An amplifier state (not specifically shown) in RF section 3 amplifies the selected RF carrier. A voltage-controlled local oscillator 7 is controlled in response to the magnitude of the tuning voltage to generate a local oscillator signal having an appropriate predetermined frequency for tuning the selected station. A mixer 9 heterodynes the selected RF carrier and the local oscillator signal to produce an IF signal. The IF signal is filtered by a first IF bandpass (BP) filter 11 and applied through a d-c blocking capacitor 13 to a signal input terminal 15 of an integrated circuit 17. Integrated circuit (IC) 17 incorporates, among other circuits, circuits for amplifying and limiting the IF signal, for decoding the IF signal and for generating a control signal which may be used to control the gain of RF section 3.

The input signal of integrated circuit 17 is amplified by preamplifier 19. The resultant signal is applied through a terminal 21 to a second IF bandpass filter 23. The filtered signal is applied through a d-c blocking capacitor 25 and a terminal 27 to the input of the first of three cascaded IF amplifier stages 29, 31 and 33.

Amplifier stages 29, 31 and 33 are limiter stages which successively amplify the IF signal. For the usable amplitude range of RF input signals, at least last limiter stage 33 is driven into a symmetrical amplitude clipping or limiting condition so as to produce a pulse signal at the output of last limiter stage 33. The pulse signal is applied through an emitter-follower amplifier stage 35 and a terminal 37 to a filter 39. Filter 39 and a differential peak detector 41, coupled to filter 39 through terminals 43 and 45, cooperate to form an FM detector which generates a signal having a amplitude representing the deviation of the frequency of the pulse IF signal from a predetermined value. The structural details of a similar FM detector are disclosed in applicant's copending U.S. patent application Ser. No. 059,460 entitled "FM Detector", filed on July 20, 1979, and assigned, like the present application, to RCA Corporation.

The output signal of differential peak detector 41 is amplified by an audio amplifier 47 and applied through a terminal 49 to an audio processing circuit 51. Audio processing circuit 51 includes a stereo decoder (not specifically shown) for decoding the audio signal to produce left and right stereo signals and speaker drivers (not specifically shown) for amplifying the stereo signals before application to speakers 53 and 55.

Limiter amplifier stages 29, 31 and 33 include differential amplifier configurations because of the relatively high signal amplification and relatively low common-mode noise amplification afforded by such configurations. Furthermore, to restrict the noise bandwidth of the IF section, amplifier stages 29, 31 and 33 are coupled through d-c blocking capacitors. Specifically, differential output points of amplifier stage 29 are connected to differential input points of stage 31 through capacitors 57 and 59 and differential output points of amplifier stage 31 are connected to differential input points of stage 33 through capacitors 61 and 63. The input portions of amplifier stages 31 and 33 include respective pairs of emitter-follower amplifiers 65 and 67 and 69 and 71 to provide high impedances for the preceding amplifier stages. Circuit implementations of the amplifier stages 29, 31 and 33 are disclosed in applicant's copending U.S. patent application Ser. No. 117,079, entitled "Circuit Arrangement Useful in Developing Decoupled Operating Voltages for IF Amplifier Stages of an Integrated Circuit", filed Jan. 31, 1980, now U.S. Pat. No. 4,327,332, and assigned, like the present application, to RCA Corporation. This application is incorporated by reference for its disclosure of suitable limiter stages.

As earlier described, when there are a number of stations providing relatively strong RF carriers, RF unit 3 may not be capable of adequately filtering out RF carriers which have not been selected. As a result, several RF carriers may be heterodyned to produce undesired intermodulation products. Therefore, it is desirable to reduce the signal gain of RF unit 3 in the presence of strong RF input signals. It has been found that RF unit 3 is most effectively controlled to inhibit the generation of intermodulation products in an RF amplitude range approximately between 10 and 500 microvolts.

Since amplifier stages 29, 31 and 33 successively amplify the input signal applied to terminal 27, amplifier stage 29 will be the last stage to amplify the input signal into a limiting condition. In other words, the amplitudes of the output signals of amplifier stage 29 will continue to increase after the output signals of amplifier stages 31 and 33 have reached limiting conditions as the amplitude of the RF carrier increases.

Specifically, the output signals produced by second and third limiter stages such as limiter stages 31 and 33 typically exhibit amplitude limiting for RF input signals approximately between 10 and 500 microvolt amplitude range of the RF input signal. Since the desired control range for RF section 3 is approximately between 10 and 500 microvolts, it is not desirable to derive the control signal from the output signals of second and third limiter stages 31 and 33. The output signal of a first limiter stage such as limiter stage 29 typically does not exhibit amplitude limiting until the amplitude of the RF input signal reaches approximately 500 microvolts. Unfortunately, however, the resolution of a control signal derived directly from the output signal of first limiter stage 29 may not be sufficient throughout the desired range, especially at lower amplitudes, to accurately and predictably control the gain of RF amplifier stages. More specifically, a control signal derived directly from the output signal of first limiter stage 29 will not, in general, be linear as a function of the amplitude of the RF input signal, plotted along a logarithmetric axis, throughout a substantial portion of the 10 to 500 microvolt range.

Figure 2:
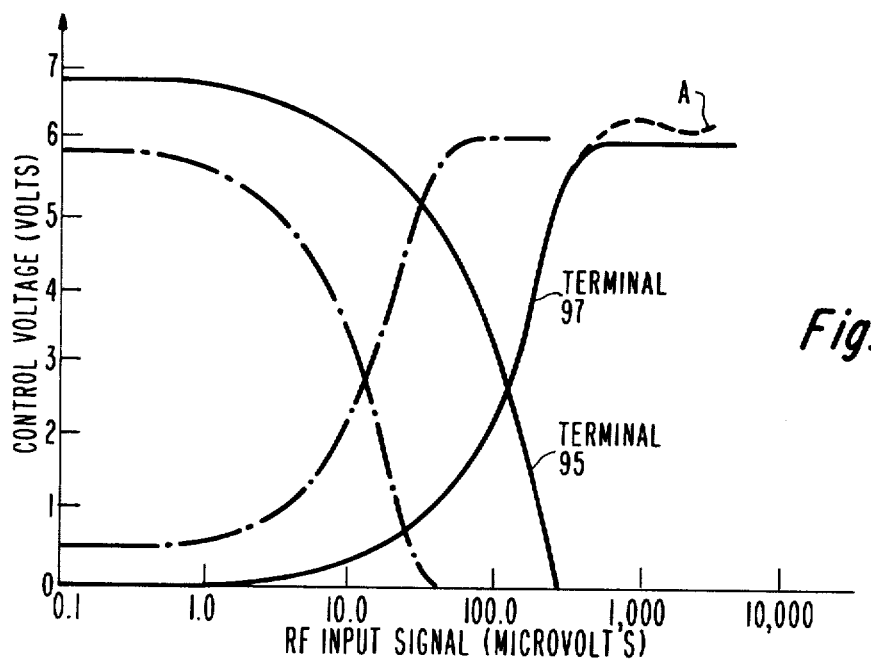
FIG. 2 is a graphic representation of gain control characteristics associated with the AGC arrangement of FIG. 1.

To overcome the above-described deficiencies, in the present receiver, an auxiliary amplifier section is employed beside or in parallel with limiter stages 31 and 33 to amplify output signal of first limiter stage 29 particularly to define the range and rate of change of a control signal derived from its output signal. Particularly, auxiliary amplifier section 73 is arranged so that the control signal has a magnitude which is at least approximately linearly related to logarithm of the amplitude of the RF input signal over a relatively large and determinable range, i.e., approximately between 10 and 500 microvolts, as is indicated in FIG. 2.

Auxiliary amplifier section 73 includes a first control amplifier 77 comprising a linear IF amplifier 77 for amplifying the output signals of first limiter stage 29 as provided at the outputs of emitter-follower amplifier 65 and 67 in the input portions of second limiter stage 31. The gain of first control amplifier 77 is selected to provide an output signal with sufficient amplitude to ensure that the output signal of a peak detector 75 coupled to the output of auxiliary amplifier section 73, generates a d-c voltage which accurately represents the amplitude of the RF input signal in a relatively low amplitude portion of the desired range. First control amplifier 77 includes a degenerative feedback (DFB) path 79 to inhibit its output signal from reaching amplitude limiting as the amplitude of the RF input signal increases in the desired range. The starting point of the desired range, i.e., the point at which changes in the amplitude of the RF signal are manifested by corresponding changes in the control signal is determined by the amount of feedback provided by feedback path 79 as will be further described with reference to the circuit implementation of first control amplifier stage 77 shown in FIG. 3.

Auxiliary amplifier section 73 includes a second control amplifier 81 comprising a gain-controlled IF amplifier coupled in cascade after first control amplifier 77. The gain of second control amplifier is degeneratively controlled in response to an auxiliary control signal derived from the voltage generated by peak detector 75. The characteristics of the auxiliary control signal are specifically selected to determine the rate of change of the main control signal. As will be described below with reference to FIG. 3, it has been found that the rate of change of the magnitude of the main control signal was decreased so that the transition of the main control signal between minimum and maximum magnitudes of the main control signal extended throughout the desired range of the RF signal between 10 and 500 microvolts when the magnitude of the auxiliary control signal was made to be logarithmically related to the magnitude of the voltage developed by peak detector 75.

The output signal of second control amplifier 81 is applied to peak detector 75 which, as will be described more fully with respect to FIG. 4, includes a capacitor which is charged in accordance with the amplitude of the output signal of second control amplifier 81. To permit a relatively small value capacitor, suitable for incorporation in integrated circuit 17, to be employed, the voltage developed across the capacitor of peak detector 75 is converted to a corresponding current by a voltage-to-current (V-C) converter 83 and the resultant current is thereafter amplified, as described below, to provide the control signal.

Prior to amplification, the current provided by voltage-to-current converter 83 is applied to a comparator arrangement 85 which limits this current to a predetermined current level after the control signal exceeds a threshold level corresponding to a predetermined relatively high amplitude level of the RF signal. This is desirable to avoid ambiguity in the control signal which might otherwise occur under very strong RF input signal conditions. Under these conditions, certain signal components may be coupled to peak detector 75 through various parasitic paths to cause the control signal to exhibit a dip or a decline in amplitude (see portion A of the characteristic of FIG. 2) although the RF signal is in fact increasing.

The current provided at the output of comparator 85 is amplified by a current (C) amplifier 87. An amplifier arrangement 89 further amplifies the output current to produce two resultant currents. A first of these currents is processed, as will be described below with reference to FIG. 3, to derive the auxiliary control signal for second control amplifier 81. The auxiliary control signal is applied to second control amplifier 81 through a conductor 105. Conductor 105 is connected to a terminal 107 and capacitor 109, selected to have a low impedance in the IF range, is connected between terminal 107 and signal ground so as to substantially remove any a-c components from the internal gain control signal applied to second control amplifier 81 which might otherwise undesirably modulate or be superimposed on the control signals.

The second resultant current produced by amplifier arrangement 89 is applied to a resistive voltage divider 193 including resistors 111 and 113. The voltage developed across voltage divider 193 is applied to a terminal 97 on a non-inverted control voltage having a magnitude directly related to the amplitude of the RF input signal. The voltage developed at the junction of resistors 111 and 113 is applied to one input of comparator 85 and a reference voltage (VREF) developed by a reference voltage supply (not shown) within integrated circuit 17 is applied to another input of comparator 85 to establish the maximum amplitude of the non-inverted control voltage and the minimum amplitude of the inverted control voltage for the reason set forth above. The output current of current amplifier 87 is also inverted by a current inverter 91. The output current of current inverter 91 is further amplified and converted to an inverted control voltage having a magnitude inversely related to the amplitude of the RF input signal. The inverted control voltage is available at a terminal 95. Two control signals having opposite senses are developed so that integrated circuit 17 may be employed in receivers having RF sections with either forward or reverse gain control arrangements.

An AGC amplifier 99 is provided within integrated circuit 17 to suitably amplify the control voltage available at either of terminals 95 or 97 so that the resultant control voltage may be used to control an attenuator, e.g., including a P-I-N diode in an RF section 3. Specifically, either of the control voltages available at terminals 95 and 97, e.g., terminal 97, may be applied to the input of AGC amplifier 99 through an input terminal 101. A voltage divider 102 may be coupled between the control voltage terminal and input terminal 101 for AGC amplifier to set the latter's range. The output voltage of AGC amplifier 99 is applied to a gain controlled amplifier stage not shown of RF section 3 through a terminal 103.

The control voltages may be employed for purposes other than controlling the signal gain of RF section 3. For example, one of the control voltages, say, the inverted control voltage available at terminal 95, may be applied to audio processing 51 to disable the operation of stereo decoder under weak signal conditions. Further, one of the control signals may be employed to mute or partially mute the audio output signal. Structure for the latter function is well known and therefore not shown.

Figure 5:
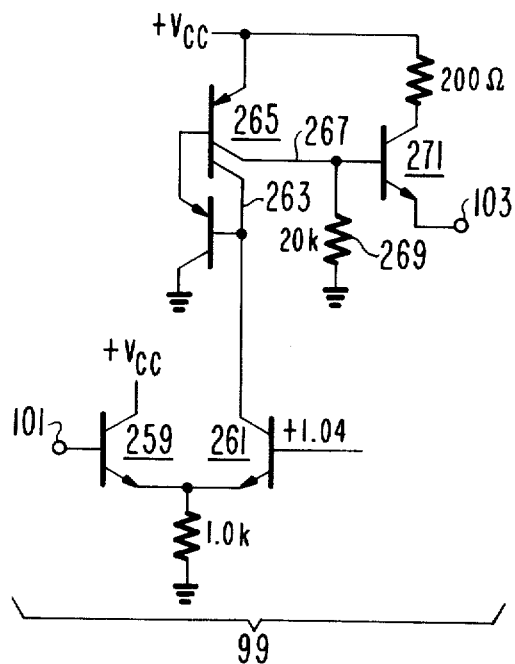
FIGS. 3–5 are schematics of circuit implementations of various portions of the AGC arrangement of FIG. 1.
Figure 3:
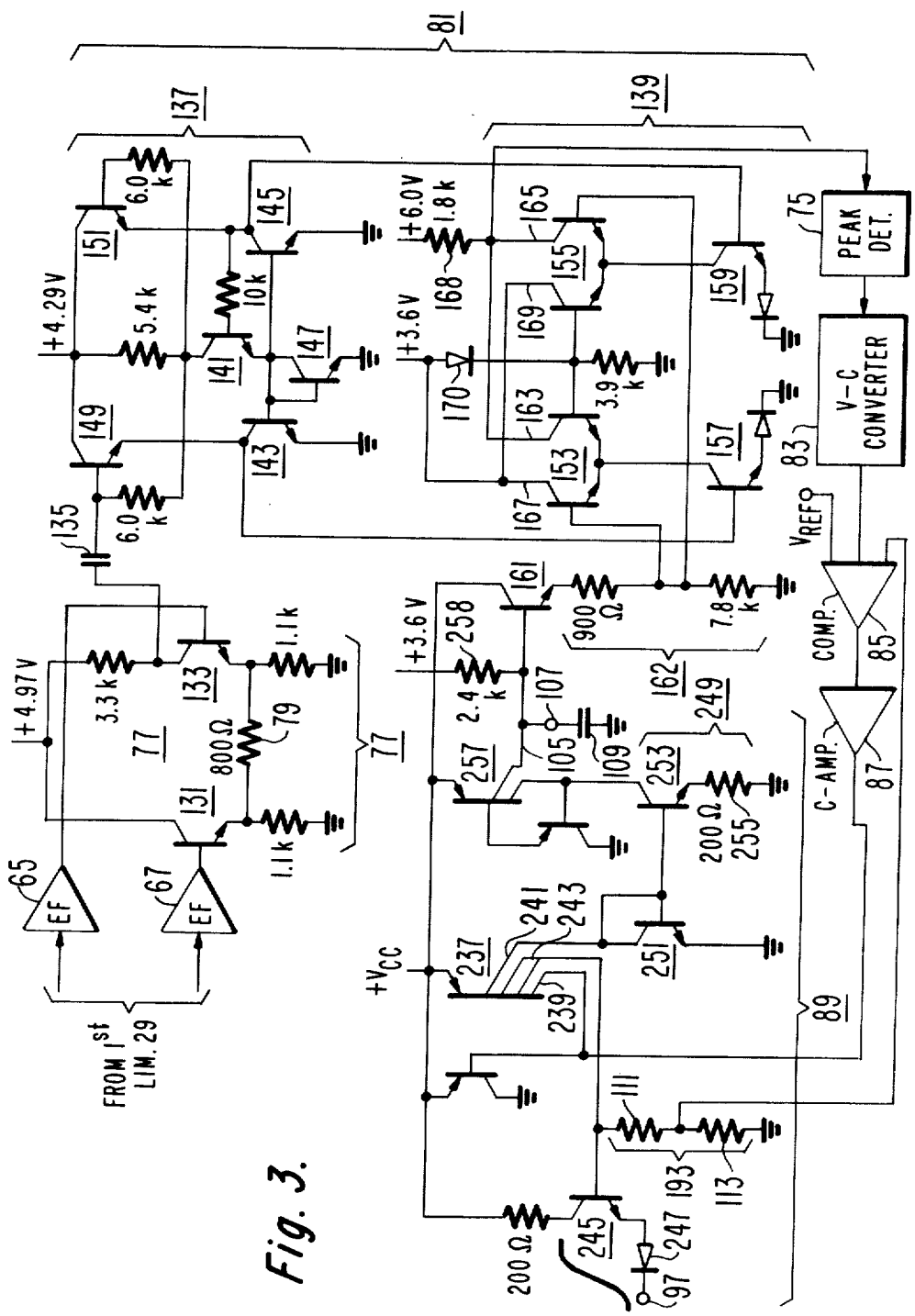
Figure 4:
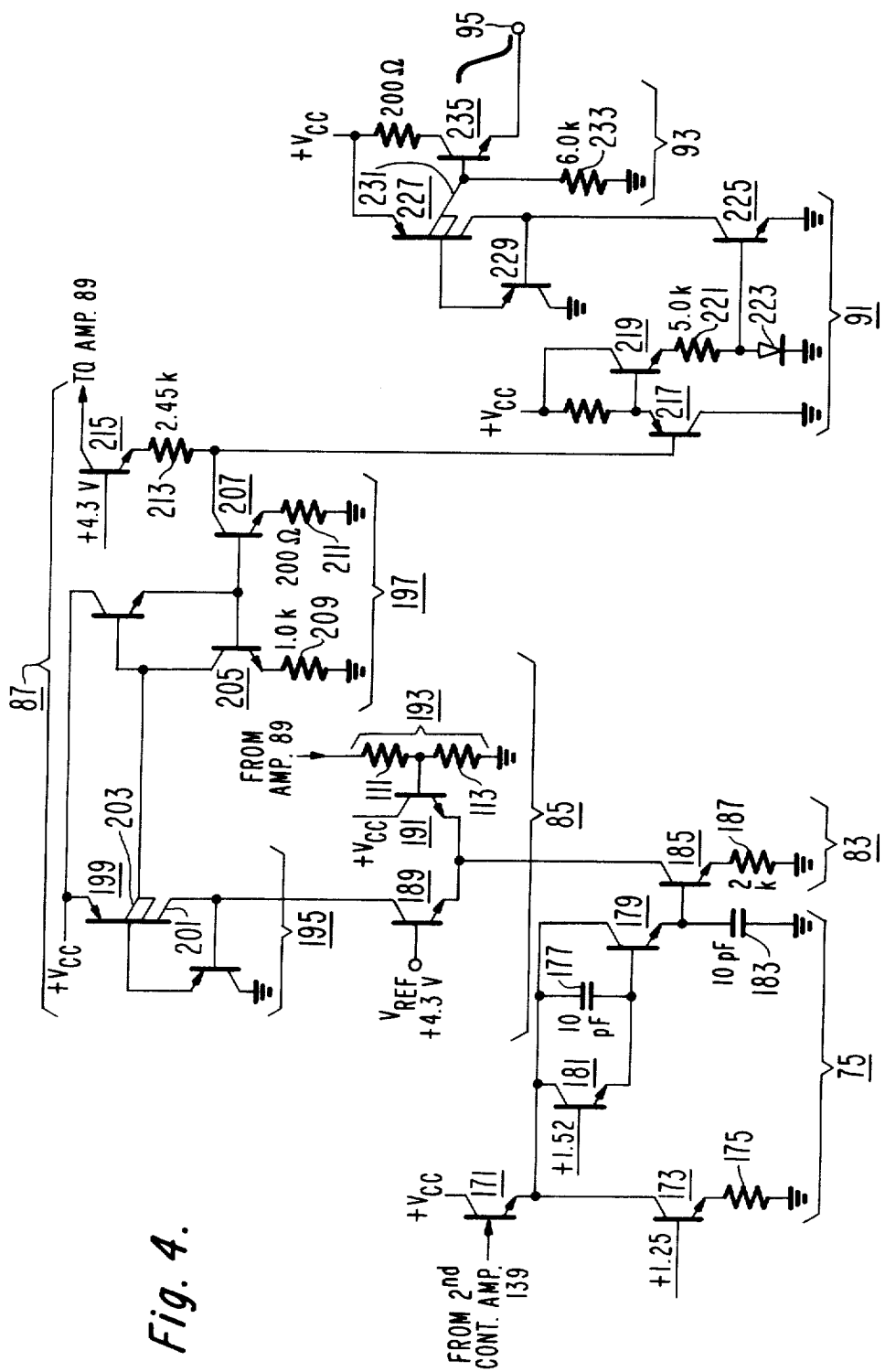

In the circuit implementations shown in FIGS. 3–5, certain typical component and regulated voltage values are indicated by way of example. The voltage +VCC is a supply voltage for integrated circuit 17 provided by an external power supply (not shown) from which the regulated voltages are derived by an internal voltage regulator (not shown) such as a band gap voltage reference supply.

The circuit implementations of first control amplifier 77, second control amplifier 81 and amplifier arrangement 89 are shown in FIG. 3. In addition, the closed loop including second control amplifier 81, peak detector 75, voltage-to-current converter 83, comparator 85, current amplifier 87 and amplifier arrangement 89 are shown, in block form, in FIG. 3 to further illustrate the derivation and application of the auxiliary control signal.

First control amplifier 77 comprises NPN transistors 131 and 133 configured as an emitter-coupled differential amplifier with differential inputs and a single-ended output. Degenerative feedback path 79 simply comprises a resistor connected between the emitters of transistors 131 and 133. The value of resistor 79 determines the degree of current feedback in the emitter circuits of transistors 131 and 133 and, accordingly, sets beginning point of the linear portion of the control signal magnitude versus RF input signal amplitude characteristics. Increasing the value of resistor 79 decreases the overall gain of first control amplifier 77 and shifts the control characteristic right, while decreasing the value of resistor 79 increases the overall gain of first control amplifier 77 and shifts the control characteristic left as is indicated by the solid and broken lines, respectively, in FIG. 2.

The output of first control amplifier 77 is coupled through a d-c blocking capacitor 135 to an input portion 137 of second control amplifier 81. Input portion 137 establishes substantially identical d-c bias conditions but unbalanced a-c conditions for an output portion 139 of second control amplifier 81.

Input portion 137 includes a multiple VBE bias configuration, where VBE is the voltage drop developed across the base-to-emitter semiconductor junctions of the transistors employed in integrated circuit 17, comprising NPN transistors 141, 143 and 145 and a diode-connected transistor 147. Specifically, NPN transistors 143 and 145, arranged in respective grounded-emitter configurations, are the output transistors of dual current mirror amplifier arrangement in which diode connected NPN transistor 147 is the input transistor. The collector currents of transistors 143 and 145 are applied to the emitters of transistors 149 and 151. A degenerative voltage feedback path is provided between the bases of transistor 151 to diode-connected transistor 147, including an NPN transistor 141 configured in emitter-follower amplifier. The degenerative feedback path conditions the bias configuration so that a d-c voltage substantially equal to 3 VBE is established at the bases of transistors 149 and 151, and a d-c voltage substantially equal to 2 VBE is established at the collectors of transistors 143 and 145. Since the a-c component of the output signal of first control amplifier 77 is applied only to the base of transistor 149, the output voltages developed at the respective emitters of transistors 149 and 151 have substantially the same d-c components but only the output signal developed at the emitter of transistor 149 has an a-c component.

Output portion 139 includes a gain-controlled IF amplifier comprising two differential amplifiers 153 and 155 having cross-coupled collector branches and emitter circuits connected to the respective collector-emitter paths of NPN transistors 157 and 159 configured as common-emitter amplifiers. The emitters of transistors 157 and 159 are connected to ground through respective forward biased diodes that tend to double the range of voltages that transistors 157 and 159 amplify without clipping. The voltage developed at the emitter of transistor 149 is applied to the base of transistor 157 to establish the emitter currents of differential amplifier 153. The voltage developed at the emitter of transistor 151 is applied to the base of transistor 159 to establish the emitter currents of differential amplifier 155.

An auxiliary control current generated by amplifier 89 is applied to a resistor 258 connected to the base of an emitter-follower configured NPN transistor 161 where an auxiliary control voltage for controlling the gains of differential amplifiers 153 and 155. The voltage difference between the voltage developed by a voltage divider 162 in the emitter circuit of transistor 161 and a fixed voltage applied by a diode-connected transistor 170 is applied across the base control inputs of differential amplifier 153 in one sense and across the base control inputs of differential amplifier 155 in the opposite sense to control the respective branch currents. The d-c components of currents flowing in collector branches 163 and 165 change in opposite sense in response to the auxiliary control current applied to the base of transistor 161 and only the currents flowing through the collector branches of differential amplifier 153 include an a-c component. Accordingly, a current formed by summing the currents flowing in collector branches 163 and 165 has an a-c component which is controlled in response to the inverted control current and a d-c component which is substantially unaffected by the auxiliary control current. The latter summed current is an output current which is applied to a resistor 168 to develop an input voltage for peak detector 75. The currents flowing in collector branches 167 and 169 are also summed to form a current having an a-c component which is controlled in response to the auxiliary control current and a d-c component which is substantially unaffected by the auxiliary control current. The maintenance of constant d-c operating conditions in gain controlled amplifier 81 is desirable to inhibit it from reaching limiting conditions, i.e., saturation or cutoff, thereby undesirably reducing the amplitude range of its output signals.

Differential amplifier 153 is a current steering arrangement responsive to the auxiliary control current provided by amplifier arrangement 89. The output current of differential amplifier 153, from which the input voltage of peak detector 75 is derived, is reduced in response to the auxiliary control current as the amplitude of the RF input signal is increased in the desired range. This tends to relatively slow the rate of change of the output current of differential amplifier 153 and thereby slows the rate of change of the main control signal derived from the output current of differential amplifier 153. It has been found that if the magnitude of the auxiliary control current is linearly related to the magnitude of the voltage developed by peak detector 75, the transition of the main control signal from the minimum magnitude to the maximum magnitude still occurs over a much smaller range than the desired range of 10 to 500 microvolts of signal strength. However, by making the magnitude of the auxiliary control current non-linearly, and specifically, logarithmically related to the magnitude of the voltage developed by peak detector 75, the transition of the main control signal from the minimum magnitude to the maximum magnitude extends over the desired range of 10 to 500 microvolts. Moreover, the magnitude of the main control signal has been found to be, at least approximately, a function of the logarithm of the amplitude of the RF input signal over the desired range. Amplifier arrangement 89 processes the output current of current amplifier 87, having a magnitude linearly related to the magnitude of the voltage developed by peak detector 75, to produce the auxiliary control current which has a magnitude logarithmically related to the magnitude of the voltage developed by peak detector 75 in the following manner.

The circuit implementation of amplifier 89 includes a multiple collector transistor 237 configured as a current mirror amplifier (CMA) having collectors 239, 241 and 243 with areas proportioned to provide a first output current at collector 241 proportional by a first predetermined gain factor, e.g., one, to the input current at collector 239 from current amplifier 87 and a second output current at collector 243 proportional by a second predetermined gain factor, e.g., two, to the input current at collector 239.

The first output current at collector 241 is applied as an input current to a logarithmic current amplifier 249 comprising a diode-connected NPN transistor 251, an NPN transistor 253 and a resistor 255. As is known, the voltage difference between the base-to-emitter voltage drops of transistors 251 and 253 developed across resistor 255 is a function of the logarithm of the ratio of the respective collector currents of transistors 251 and 253. The collector current of transistor 253 is proportionally related to the voltage difference between the base-to-emitter voltage drops of transistors by Ohm's law. Accordingly, the collector current of transistor 253 is a logarithmic function of the collector current of transistor 251.

The collector current of transistor 253 is applied to a CMA 257 as the auxiliary control current to resistor 258 connected between a point of reference voltage and the base of transistor 161. The auxiliary control voltage developed at the base of transistor 161 is proportional, according to Ohm's law, to the auxiliary control current. The ratio of resistor of the values of resistor 258 to resistor 255 is selected so that the amplification range of differential amplifier 153, i.e., the range in which its output current varies with variations in its input current, corresponds to the desired control range. The ratio of the values of resistor 258 to resistor 255 also determines the magnitude of the auxiliary control signal, i.e., the linearity of the magnitude of the main control signal as a function of the amplitude of the RF input signal. The higher the ratio, the more nearly linear is the relationship between the magnitude of the main control signal and the logarithm of the amplitude of the RF input signal.

The values of the resistors of voltage divider 162 in the emitter circuit of transistor 161 are selected to determine the point at which the right-most transistor of differential amplifier 153 is fully conductive. For the large control range, it is desirable to select the values of the resistor of voltage divider 162 so that the right-most transistor of differential amplifier 133 is conductive at a point corresponding to the beginning, e.g., 10 microvolts, of the control range.

The second output current of CMA 237 provided at collector 243 is applied to voltage divider 193 associated with comparator 85 (as shown also in FIG. 4) to develop a control voltage having a magnitude directly proportional to the amplitude of the signal strength in the predetermined amplitude range. This control voltage is applied to terminal 97 through an emitter-follower configured NPN transistor 245 and a diode 247. Diode 247 reduces the magnitude of the control voltage at terminal 97 to compensate for the presence of undesired noise signals which manifest themselves as an offset in the control voltage. As a result, the non-inverted control voltage developed at terminal 97 has a magnitude near zero when no RF signal is being received.

The circuit implementations of peak detector 75, voltage-to-current converter 83, comparator 85, current amplifier 87, current inverter 91 and amplifier arrangement 93 are shown in FIG. 4.

Peak detector 75 comprises an NPN transistor 171 in an emitter-follower amplifier configuration with a load comprising the collector-emitter path of an NPN transistor 173 connected in series with a resistor 175 between its emitter and signal ground. The signal developed at the emitter of transistor 171 is applied through a d-c blocking capacitor 177 to the base of an NPN transistor 179 which is configured as an emitter-follower amplifier. An NPN transistor 181 establishes the base bias voltage (approximately 2 $V_{BE}$ for transistor 179. A capacitor 183, connected between the emitter of transistor 179 and signal ground, is charged in response to positive-going excursions of the signal applied to the base of transistor 179 to develop a d-c voltage having a magnitude directly related to the amplitude of the signal applied to the base of transistor 179. A peak detector similar to peak detector 75 is described in detail in U.S. Pat. No. 3,701,022, entitled "Peak-to-Peak Detector", issued in the name of Craft on Oct. 24, 1972, and assigned, like the present application, to RCA Corporation.

Voltage-to-current converter 83 simply comprises an NPN transistor 185 configured as common-emitter amplifier with an emitter degeneration resistor 187 connected between its emitter and signal ground. A voltage substantially equal to the voltage developed at the emitter of transistor 179 of peak detector 81 less $V_{BE}$ is established by emitter-follower action across resistor 187. This voltage determines, in accordance with Ohm's law, a proportional current flowing through the collector-emitter path of transistor 185.

Comparator 85 comprises NPN transistors 189 and 191 configured in a current-steering configuration. The current provided by voltage-to-current converter 83 is applied to the junction of the emitters of transistors 189 and 191. A reference voltage (VREF) is applied to the base of transistor 189 and a voltage developed at the output of voltage divider 193 in response to a non-inverted control current provided by current amplifier 89 is applied to the base of transistor 191. The output current of comparator 85 flowing through the collector-emitter path of transistor 189 is applied to current amplifier 87. When the voltage at the base of transistor 191 is below the reference voltage, transistor 189 is conductive and transistor 191 is non-conductive. As a result, substantially all of the current provided by voltage-to-current converter 83 is applied to current amplifier 87. As the voltage at the base of transistor 191 approaches the reference voltage, transistor 189 is rendered less conductive and transistor 191 is rendered more conductive. As a result, the current provided to amplifier 87 by voltage-to-current converter 83 is reduced. Simce comparator 85 is included in a closed loop configuration, the current provided by comparator 85 to amplifier 87 is limited at a maximum value.

Current amplifier 87 comprises two cascaded current mirror amplifiers (CMA) 195 and 197. CMA 195 includes a multiple collector PNP transistor 199 having two collector regions 201 and 203 with areas proportioned to provide a predetermined current gain, e.g., two. CMA 197 includes two NPN transistors 205 and 207 having respective emitter resistors 209 and 211 with values proportioned to provide a predetermined current gain, e.g., five. The current provided at the collector of transistor 207 is applied through a resistor and the collector emitter path of an NPN transistor 215 to amplifier arrangement 89.

The magnitude of the voltage developed at the collector of transistor 207 is directly related to the magnitude of the current supplied to amplifier 89 through resistor 213 and the collector-emitter path of transistor 215. This relationship is advantageously employed in inverter 91 to generate a current having a magnitude which is inversely related to the magnitude of the current supplied to amplifier 89. Specifically, the voltage developed at the collector of transistor 207 is applied through an emitter-follower configured PNP transistor 217 followed in cascade by an emitter-follower configured NPN transistor 219 to a resistor 221 connected in series with a diode 223. The base-emitter voltage drops of transistors are substantially the same in magnitude but opposite in sense and therefore effectively cancel one another between the base of transistor 217 and the emitter of transistor 219. Diode 223 and an NPN transistor comprise a CMA which provides current to amplifier 93. The values of resistors 213 and 221 are proportioned to determine the magnitude of the current provided to amplifier arrangement 93.

Amplifier arrangement 93 includes a multiple collector PNP transistor 227 configured as a CMA having collectors 229 and 231 with areas proportioned to provide an output current at collector 231 proportional by a predetermined gain factor, e.g., two, to the input current at collector 227. The output current provided at collector 229 is applied to a resistor 233 to develop a control voltage having a magnitude inversely proportional to the amplitude of the RF input signal strength. This control voltage is applied to terminal 95 through an emitter-follower configured NPN transistor 235.

A circuit implementation of AGC amplifier 99 is shown in FIG. 5. The control voltage is applied through terminal 101 to the base of an NPN transistor 259 comprising together with an NPN transistor 261 a current steering network. A regulated supply voltage is applied to the base of transistor 261. The current provided at the collector of transistor 261 is applied to a first collector 263 of a multiple-collector PNP transistor 265 included in a CMA configuration. The current provided at a second collector 267 of transistor 265 is applied to a resistor 269 to develop a corresponding voltage. The latter voltage is applied through an emitter-follower configured NPN transistor 271 to terminal 103. The current applied to collector 263 of transistor 265 and, as a result, the voltage developed at terminal 103 is inversely related to the magnitude of the voltage difference between the control voltage applied to terminal 101 and the regulated voltage applied to the base of transistor 261. The configuration of AGC amplifier 99 is appropriate for controlling a P-I-N diode attenuator. It may also be used to apply a forward gain control signal to a bipolar transistor or to reverse-bias an FET amplifier to reduce its gain.

Thus, in summary, what has been disclosed is an auxiliary amplifier arrangement for deriving a well-defined output signal from an intermediate signal developed at a point in a cascade of IF limiter stages from which a main control signal having a magnitude representing the amplitude of an input signal to the cascade is derived over a relatively large input range, e.g., 10 to 500 microvolts. Such a main control signal is advantageously employed to reduce the gain of RF stages to inhibit the production of intermodulation products. To this end, it has been found desirable that the auxiliary amplifier arrangement include a gain controlled amplifier and a degenerative feedback arrangement for generating an auxiliary control signal for reducing the gain controlled stage as the amplitude of the input signal increases. Preferably, the magnitude of the auxiliary control signal is non-linearly related to the amplitude of the input signal so that its rate of change decreases as the amplitude of the input signal increases. The auxiliary control signal is desirably achieved by means of a logarithmic current amplifier responsive to an input current having a magnitude proportional to the main control signal. The logarithmic current amplifier may simply comprise a diode connected transistor (251) in parallel with the series connection of the base-emitter junction of a further transistor (253) and a resistor (255), the input current being applied to the collector of the diode connected transistor and the auxiliary control current being derived from the collector of the further transistor.

It is further noted that in the present arrangement multiplication of a logarithmic term is readily obtained by transferring the output current through a current mirror amplifier (257) to a resistor (258) connected to the base of an emitter-follower transistor (161) to develop an auxiliary control voltage. The ratio of the latter resistor (258) to the resistor in the logarithmic current amplifier (255) determines the multiplication factor. Since the multiplication factor of a logarithm of a number is the power to which the number is raised, the auxiliary control voltage is related by a logarithmic function to the main control signal raised to a power. This is useful because a signal representing the logarithm of the power of a variable may be fedback to a differential amplifier to derive a signal representing the root of the variable. For example, a root extraction circuit generally of this type is disclosed in U.S. Pat. No. 3,689,752, entitled "Four-Quadrant Multiplier Circuit", issued in the name of Gilbert on Aug. 5, 1972 (specifically with reference to FIG. 24). The Gilbert arrangement employs a number, n, of stacked diodes to obtain the $n^{th}$ root of a variable. Thus, to obtain a high order root, a large number of stacked diodes must be employed. The present logarithmic amplifier is more desirable for such a root extraction arrangement since the power of the root is simply determined by a ratio of resistors rather than by the number of diodes in a stack.

The values of components employed in the circuit implementations of FIGS. 3–5 shown are selected to provide the characteristics of the non-inverted and inverted control voltages indicated by solid lines in FIG.

2 whereby the magnitude of the control voltages vary approximately between 0 and 7 volts with RF input signal amplitude variations between approximately 10 to 500 microvolts. It will be appreciated, of course, that the values of components may be changed to provide different control characteristics. Furthermore, while the present invention has been described with reference to an FM receiver it may be employed in other receivers employing limiters which process angle-modulated carriers such as those which process phase-modulated or pulse width modulated carrier. In this connection is is intended that the term angle-modulation encompass any communication process in which information is conveyed by the time relationship of a carrier with respect to a predetermined reference signal. In such other receivers, it may be desirable that an auxiliary amplifier section of the type described above process the output signal of a limiter stage after the first limiter to obtain a control signal which represents the amplitude of an input signal over a desired range of input signal amplitudes lower than the one disclosed above. These and other modifications are intended to be included within the scope of the present invention as defined by the following claims.

What is claimed is:

1. In a receiver for processing RF signals modulated to represent information by time relationships, apparatus comprising:
   tuner means responsive to said RF signals for deriving an IF signal from a selected one of said RF signals;
   IF means including a plurality of cascaded limiter amplifier stages for successively amplifying said IF signal to form a pulse signal;
   information detector means for detecting the time relationship of said pulse signal to develop an information signal;
   auxiliary amplifier means beside said cascade of said limiter amplifier stages and including gain control means responsive to an auxiliary control signal for amplifying an intermediate signal developed at an intermediate point in said cascade to develop an output signal;
   detector means for generating an amplitude representative signal having a magnitude representing the amplitude of said output signal of said auxiliary amplifier means;
   control signal generating means for generating a main control signal and said auxiliary control signal in response to said amplitude representative signal, said control signal generating means includes non-linear processing means for causing the magnitude of said auxiliary control signal to be non-linearly related to the magnitude of said main control signal; and
   utilization means for controlling a predetermined function of said receiver in response to said main control signal.

2. The apparatus recited in claim 1 wherein:
   said non-linear signal means includes a logarithmic amplifier for generating said auxiliary control signal in response to said amplitude representative signal so that the amplitude of said auxiliary control signal has an amplitude which is a logarithmic function of the magnitude of the amplitude representative signal.

3. The apparatus recited in claim 2 wherein:
   said gain control means includes a differential amplifier having a differential input to which said auxiliary control signal is applied and a common input to which said intermediate signal is applied.

4. The apparatus recited in claim 3 wherein:
   said detector means includes first converter means for converting said amplitude representative signal to a corresponding amplitude representative current; and
   said logarithmic amplifier includes a bipolar transistor having base, emitter and collector electrodes; a resistor connected between said emitter and a point of reference potential; and a diode connected between said base and said point of reference potential, said amplitude representative current being applied to said diode; and second converter means for converting a current developed at the collector of said transistor to a voltage, said voltage being applied to said differential input of said differential amplifier.

5. The apparatus recited in claim 4 wherein:
   said second converter means includes a second resistor having a high resistance value compared to the resistance value of said first mentioned resistor.

6. The apparatus recited in claim 5 wherein:
   said auxiliary amplifier means is responsive to the output signal of the first one of said limit amplifier stages.

7. The apparatus recited in claim 6 wherein:
   said auxiliary amplifier means includes an amplifier stage, including a degenerative feedback path, coupled between said predetermined point and said gain control means.

8. The apparatus recited in claim 7 wherein:
   said detector means includes amplitude limiting means for inhibiting the amplitude of said amplitude representative signal from exceeding a predetermined level.

9. The apparatus recited in claim 8 wherein:
   said control means generates first and second main control signals having magnitudes which change in opposite senses in response to said amplitude representative signals.

10. The apparatus recited in claim 1 wherein:
    said utilization means comprises a gain control amplifier in said tuner means for reducing the amplitudes of said RF signals as the amplitude of said intermediate signal increases.

11. The apparatus recited in claim 1 wherein:
    said auxiliary amplifier means includes input means for developing an input current in response to said intermediate signal; and differential amplifier means for amplifying said input current to develop an output current including gain control means for controlling the gain of said differential amplifier means in response to a control voltage;
    said non-linear processing means includes logarithmic means for developing a logarithmic voltage having magnitude related to the logarithm of the amplitude of the output current of said differential amplifier; subtraction means for subtracting a substantially constant voltage from said logarithmic voltage to obtain a difference voltage; and multiplication means for multiplying said difference voltage by a constant greater than one to develop said control voltage.

12. The apparatus recited in claim 11 wherein:

said logarithmic means includes a first transistor having base, emitter and collector electrodes, said base and collector electrodes of said first transistor being connected together, said collector electrode of said first transistor being coupled to be responsive to said output current, said emitter electrode of said first transistor being connected to a circuit point;

said subtraction means includes a second transistor having base, emitter and collector electrodes, said base electrode of said second transistor being connected to the collector electrode of said first transistor; and a first resistor connected between said emitter electrode of said second transistor and said circuit point; and multiplication means includes a second resistor coupled to said collector electrode of said second transistor having a resistance value greater than the resistance value of said first resistor.

13. The apparatus recited in claim 12 wherein:

said differential amplifier includes third and fourth transistors each having base, emitter and collector electrodes, said emitter electrodes of said third and fourth transistors being connected together, said input current being applied to said emitter electrodes of said third and fourth transistors, said output current being provided at one of said collectors of said third and fourth transistors, one of said bases of said third and fourth transistors being connected at a point between said collector of said second transistor and said second resistor.

14. The apparatus recited in claim 13 wherein:

a current mirror amplifier is coupled between the collector of said second transistor and said second resistor.

15. The apparatus recited in claim 14 wherein:

a peak detector including a filter capacitor is coupled between said one of said collectors of said third and fourth transistors and said collector of said first transistor.

16. Apparatus comprising:

input means for supplying an angle-modulated carrier;

limiter means including a plurality of cascaded limiter stages for successively amplifying said angle-modulated carrier for forming a pulse signal;

information detector means for deriving an information signal in response to said pulse signal;

first and second linear amplifier stages coupled in cascade beside at least a portion of said cascade of said limiter amplifier stages for amplifying an intermediate signal developed at an intermediate point in said cascade to develop an output signal, said first linear amplifier including a degenerative feedback path, said second linear amplifier including gain control means;

detector means for generating an amplitude representative signal in response to said output signal having a magnitude representing the amplitude of said output signal;

control means responsive to said amplitude representative signal for generating a main control signal having a magnitude substantially linearly related to the magnitude of said amplitude representative signal and an auxiliary control signal having a magnitude substantially non-linearly related to the magnitude of said amplitude representative signal; and utilization means for utilizing said main control signal;

said auxiliary control signal being applied to said gain control means for degeneratively controlling the gain of said second linear amplifier.

* * * * *